(12) United States Patent
Van Der Schoot et al.

(10) Patent No.: US 8,174,680 B2
(45) Date of Patent: *May 8, 2012

(54) SUBSTRATE HANDLER, LITHOGRAPHIC APPARATUS AND DEVICE MANUFACTURING METHOD

(75) Inventors: Harmen Klaas Van Der Schoot, Vught (NL); Hernes Jacobs, Eindhoven (NL); Bernardus Antonius Johannes Luttikhuis, Nuenen (NL); Petrus Matthijs Henricus Vosters, Bladel (NL); Johannes Martinus Andreas Hazenberg, Veldhoven (NL); Aart Adrianus Van Beuzekom, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 432 days.

This patent is subject to a terminal disclaimer.

(21) Appl. No.: 12/512,220

(22) Filed: Jul. 30, 2009

(65) Prior Publication Data

US 2009/0284730 A1 Nov. 19, 2009

Related U.S. Application Data

(63) Continuation of application No. 11/175,037, filed on Jul. 6, 2005, now Pat. No. 7,576,835.

(51) Int. Cl.
*G03B 27/58* (2006.01)
*G03B 27/52* (2006.01)

(52) U.S. Cl. .......................................... 355/72; 355/30
(58) Field of Classification Search .................... 355/30, 355/53, 72–76; 118/722–725
See application file for complete search history.

(56) References Cited

U.S. PATENT DOCUMENTS

| | | | |
|---|---|---|---|
| 4,667,076 A | 5/1987 | Amada | |
| 5,229,872 A | 7/1993 | Mumola | |
| 5,296,891 A | 3/1994 | Vogt et al. | |
| 5,523,193 A | 6/1996 | Nelson | |
| 5,738,165 A | 4/1998 | Imai | |
| 6,514,073 B1 | 2/2003 | Toshima et al. | |
| 6,781,669 B2 | 8/2004 | Tanaka | |
| 6,823,876 B1 | 11/2004 | Chang et al. | |
| 7,070,661 B2 | 7/2006 | Eiriksson et al. | |
| 7,242,458 B2 | 7/2007 | Munnig Schmidt | |
| 7,576,835 B2 * | 8/2009 | Van Der Schoot et al. | 355/72 |
| 2004/0094186 A1 | 5/2004 | Ivanov | |
| 2004/0265493 A1 | 12/2004 | Mizuno et al. | |
| 2006/0139616 A1 | 6/2006 | Jacobs et al. | |
| 2006/0158634 A1 | 7/2006 | Jacobs et al. | |

FOREIGN PATENT DOCUMENTS

JP 2000-007151 A 1/2000
(Continued)

OTHER PUBLICATIONS

Non-Final Rejection mailed Sep. 27, 2007 for U.S. Appl. No. 11/175,037, 8 pgs.

(Continued)

*Primary Examiner* — Hung Henry Nguyen
(74) *Attorney, Agent, or Firm* — Sterne, Kessler, Goldstein & Fox P.L.L.C.

(57) ABSTRACT

An apparatus, method, and system is provided to condition a substrate. The apparatus can include a substrate handler, an array of diodes, and a projection system. The substrate handler can include a conditioning device, a float device, and a displacing device. The array of diodes can be configured to provide a patterned radiation beam, where the projection system projects the patterned radiation beam onto a target portion of a conditioned substrate.

21 Claims, 5 Drawing Sheets

FOREIGN PATENT DOCUMENTS

| | | |
|---|---|---|
| JP | 2000-021949 A | 1/2000 |
| JP | 2001-250854 A | 9/2001 |
| JP | 2001-250857 A | 9/2001 |
| WO | WO 98/33096 A1 | 7/1998 |
| WO | WO 98/38597 A2 | 9/1998 |
| WO | WO 98/38597 A3 | 9/1998 |

OTHER PUBLICATIONS

Final Rejection mailed Apr. 8, 2008 for U.S. Appl. No. 11/175,037, 8 pgs.

Second Non-Final Rejection mailed Jul. 28, 2008 for U.S. Appl. No. 11/175,037, 7 pgs.

Third Non-Final Rejection mailed Dec. 15, 2008 for U.S. Appl. No. 11/175,037, 5 pgs.

Notice of Allowance mailed Mar. 30, 2009 for U.S. Appl. No. 11/175,037, 4 pgs.

English-Language Abstract for Japanese Patent Publication No. 2000-007151 A, published Jan. 11, 2000; 1 page.

English-Language Abstract for Japanese Patent Publication No. 2000-021949 A, published Jan. 21, 2000; 1 page.

English-Language Abstract for Japanese Patent Publication No. 2001-250854 A, published Sep. 14, 2001; 1 page.

English-Language Abstract for Japanese Patent Publication No. 2001-250857 A, published Sep. 14, 2001; 1 page.

English-Language Translation of Notification of Reason(s) for Refusal directed to related Japanese Patent Application No. 2009-203315, mailed Jan. 31, 2012, from the Japanese Patent Office; 2 pages.

\* cited by examiner

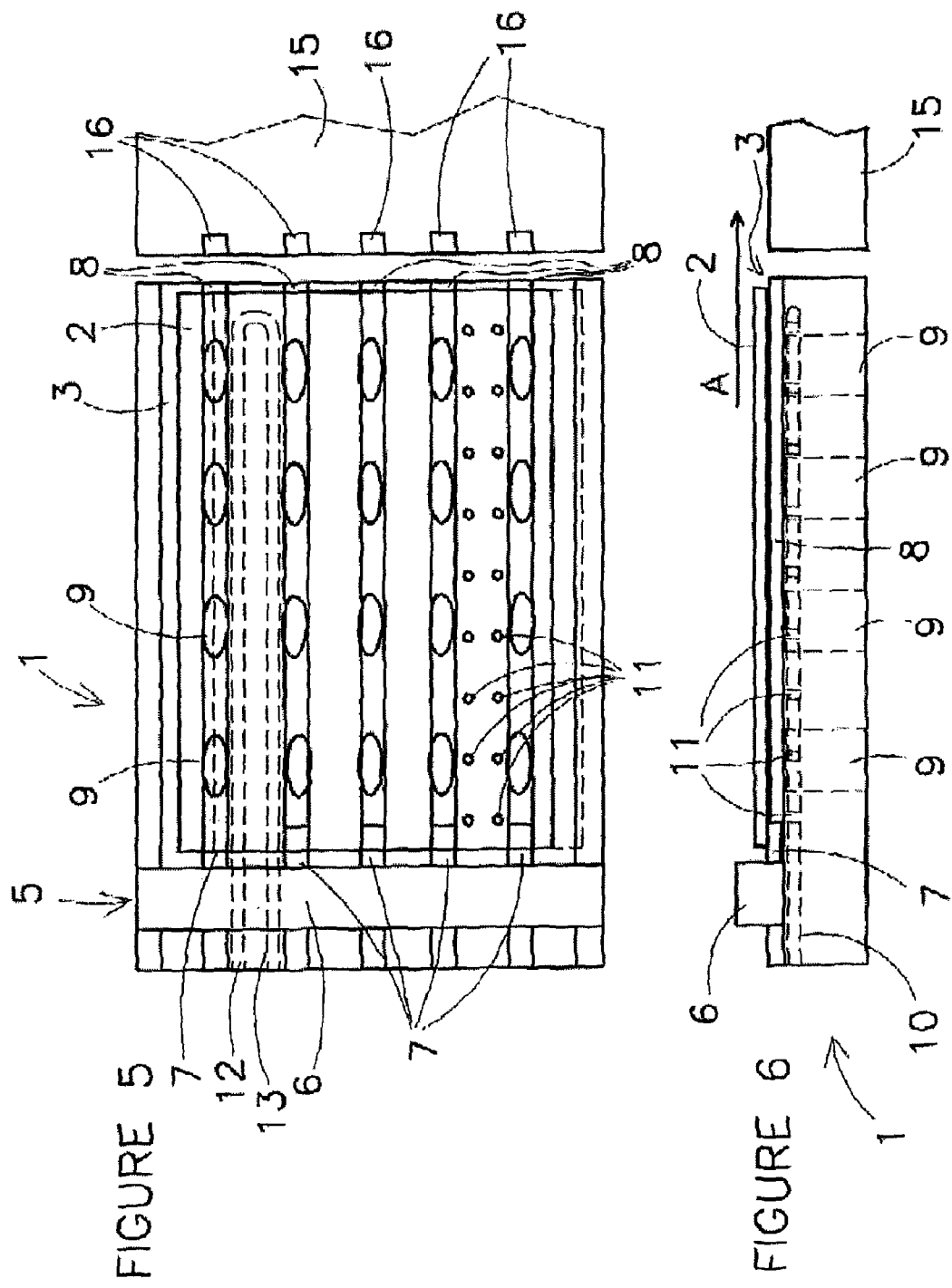

SUBSTRATE HANDLER, LITHOGRAPHIC APPARATUS AND DEVICE MANUFACTURING METHOD

CROSS REFERENCE TO RELATED APPLICATION

This application is a continuation application of U.S. patent application Ser. No. 11/175,037, filed Jul. 6, 2005, now U.S. Pat. No. 7,576,835, entitled "Substrate Handler, Lithographic Apparatus and Device Manufacturing Method," which is incorporated herein by reference in its entirety.

BACKGROUND

1. Field

The present invention relates to a substrate handler, a lithographic apparatus and a method for manufacturing a device.

2. Related Art

A lithographic apparatus is a machine that applies a desired pattern onto a substrate or part of a substrate. A lithographic apparatus may be used, for example, in the manufacture of flat panel displays, integrated circuits (ICs) and other devices involving fine structures. In a conventional apparatus, a patterning device, which may be referred to as a mask or a reticle, may be used to generate a circuit pattern corresponding to an individual layer of a flat panel display (or other device). This pattern may be transferred on (part of) the substrate (e.g., a glass plate), e.g., via imaging onto a layer of radiation-sensitive material (resist) provided on the substrate.

Instead of a circuit pattern, the patterning device may be used to generate other patterns, for example a color filter pattern, or a matrix of dots. Instead of a mask, the patterning device may comprise a patterning array that comprises an array of individually controllable elements. A benefit of such a system compared to a mask-based system is that the pattern may be changed more quickly and for less cost.

A flat panel display substrate may be rectangular in shape. Lithographic apparatus designed to expose a substrate of this type may provide an exposure region which covers a full width of the rectangular substrate, or which covers a portion of the width (for example half of the width). The substrate may be scanned underneath the exposure region, while the mask or reticle is synchronously scanned through the projection beam. In this way, the pattern is transferred to the substrate. If the exposure region covers the full width of the substrate, then exposure may be completed with a single scan. If the exposure region covers, for example, half of the width of the substrate, then the substrate may be moved transversely after the first scan, and a further scan is typically performed to expose the remainder of the substrate.

The known lithographic apparatus comprises a substrate handler for loading and/or unloading a substrate on/from the substrate table, respectively. This known substrate handler comprises a conditioning device for conditioning a substrate before the substrate is loaded on the substrate table. Such conditioning process comprises bringing the substrate to a relative uniform temperature. For instance, the temperature of a substrate before conditioning may be 23±2° C. while after conditioning the temperature within the substrate may be brought to a range of 23±0.03° C. The conditioning device of the known substrate handler comprises a conditioning water circuit which is integrated in under the support surface of substrate handler. During conditioning the substrate rests on the support surface, whereby the constant temperature of the support surface which results from the conditioning water circuit, provides for the conditioning of the substrate.

However, due to irregularities, such as cutouts or discontinuities, in the support surface which have to be present for handling the substrate, it may be difficult to obtain a uniform temperature in the substrate supported on the support surface. Such irregularities for instance comprise grooves for accommodating gripping fingers of a gripping device, openings for accommodating a lifting device, such as E-pins, for lifting a substrate from the support surface to make exchange with a robot possible, and pimples provided on the table to avoid the transfer of particles from substrate handler to the substrate table on which the pattern is projected on the substrate.

For example, the temperature offset of a part of the substrate above a cutout (for example a groove with a width of 7 mm) may be about 1° C. This may result in a non-uniform thermal expansion of the substrate (perpendicular to the grooves about 22 nm per groove of 7 mm width, which results with 18 grooves per substrate in about 400 nm total expansion per substrate; and in the direction of the grooves an expansion of more than 1 µm). Such non-uniform thermal expansion is generally unacceptable for the application of the substrate in a lithographic apparatus, since it may lead to non-uniform quality of the substrate products.

The influence of irregularities in the support surface becomes for example apparent when glass substrates are conditioned on a support surface of a substrate handler. In order to obtain a substantially uniform temperature distribution in the substrate, it is desirable to considerably increase the conditioning time, compared to a support surface without such irregularities. For instance, when the conditioning time for a substrate on a support them surface without grooves is about 15 seconds, the conditioning time for a substrate on a similar support surface that is provided with grooves may be over 120 seconds. This results in a lower throughput of the substrate handler, and therewith possibly a lower throughput of the lithographic apparatus. Such lower throughput is undesirable.

This effect caused by irregularities in the support surface of the substrate handler may also be present when conditioning other substrates such as for instance Si-substrates. As a consequence, the throughput of such substrates in the substrate handler shall be relatively lower when grooves or other irregularities are present, since the conditioning time needed to obtain a uniform temperature distribution in the substrate is longer.

It is desirable that the bottom side of the substrate be free of any particles such as dust, when the substrate is laid down on the support surface of the substrate table for the conditioning thereof. This contamination is in particular not desirable as these particles may be transferred with the substrate to the substrate table, where they form a risk for final product quality. Moreover, the particles may after being transferred to the substrate table, stick to the support surface of the substrate table and therefor form a considerable risk for the product quality of substrates which are subsequently put on the substrate table for an exposure process.

SUMMARY

Embodiments of the invention include a substrate handler comprising a conditioning device, which substrate handler is capable of conditioning a substrate on a support surface with irregularities to an acceptable temperature range, i.e., a substantial uniform temperature distribution, in the substrate, and within an acceptable conditioning time. Embodiments of the invention further include a substrate handler which avoids risk of contamination of a substrate handled by the substrate handler.

In an embodiment, there is provided a substrate handler for handling a substrate, comprising a conditioning device for conditioning the substrate, wherein the substrate handler comprises a displacing device configured to displace the substrate in a direction substantially parallel to the support surface, wherein the displacing device is configured to displace the substrate during the conditioning process from one conditioning position to one or more other conditioning positions.

In an embodiment, there is provided a substrate handler for handling a substrate, comprising a conditioning device for conditioning the substrate and a float device for providing an air bed above a support surface of the substrate handler, the substrate handler being configured to keep the substrate floating on the air bed during conditioning of the substrate.

In an embodiment, there is provided a lithographic apparatus comprising an illumination system configured to condition a radiation beam, an array of individually controllable elements capable of modulating the cross-section of the radiation beam, a substrate table constructed to support a substrate and a projection system configured to project the modulated radiation beam onto a target portion of the substrate supported on the substrate table, wherein the lithographic apparatus comprises a substrate handler for handling a substrate, comprising a conditioning device for conditioning the substrate, wherein the substrate handler comprises a displacing device configured to displace the substrate in a direction substantially parallel to the support surface, wherein the displacing device is configured to displace the substrate during the conditioning process from one conditioning position to one or more other conditioning positions, which substrate handler is further configured to load a substrate on the substrate table.

In an embodiment, there is provided a lithographic apparatus comprising an illumination system configured to condition a radiation beam, an array of individually controllable elements capable of modulating the cross-section of the radiation beam, a substrate table constructed to support a substrate and a projection system configured to project the modulated radiation beam onto a target portion of the substrate supported on the substrate table, wherein the lithographic apparatus comprises a substrate handler for handling a substrate, comprising a conditioning device for conditioning the substrate and a float device for providing an air bed above a support surface of the substrate handler, the substrate handler being configured to keep the substrate floating on the air bed during conditioning of the substrate, which substrate handler is further configured to load a substrate on the substrate table.

In an embodiment, there is provided a method for manufacturing a device comprising conditioning a substrate being supported on a support surface of a substrate handler, wherein during a conditioning process the substrate is displaced from one conditioning position to one or more other conditioning positions.

In an embodiment, there is provided a method for manufacturing a device comprising conditioning a substrate being supported on a support surface of a substrate handler, wherein the substrate is kept floating on an air bed above the support surface during conditioning of the substrate.

BRIEF DESCRIPTION OF THE DRAWINGS

FIG. 5 depicts a schematic top view of a substrate handler according to an embodiment of the invention; and FIG. 6 depicts a schematic side view of the substrate handler shown in FIG. 5.

DETAILED DESCRIPTION

Figure 1:
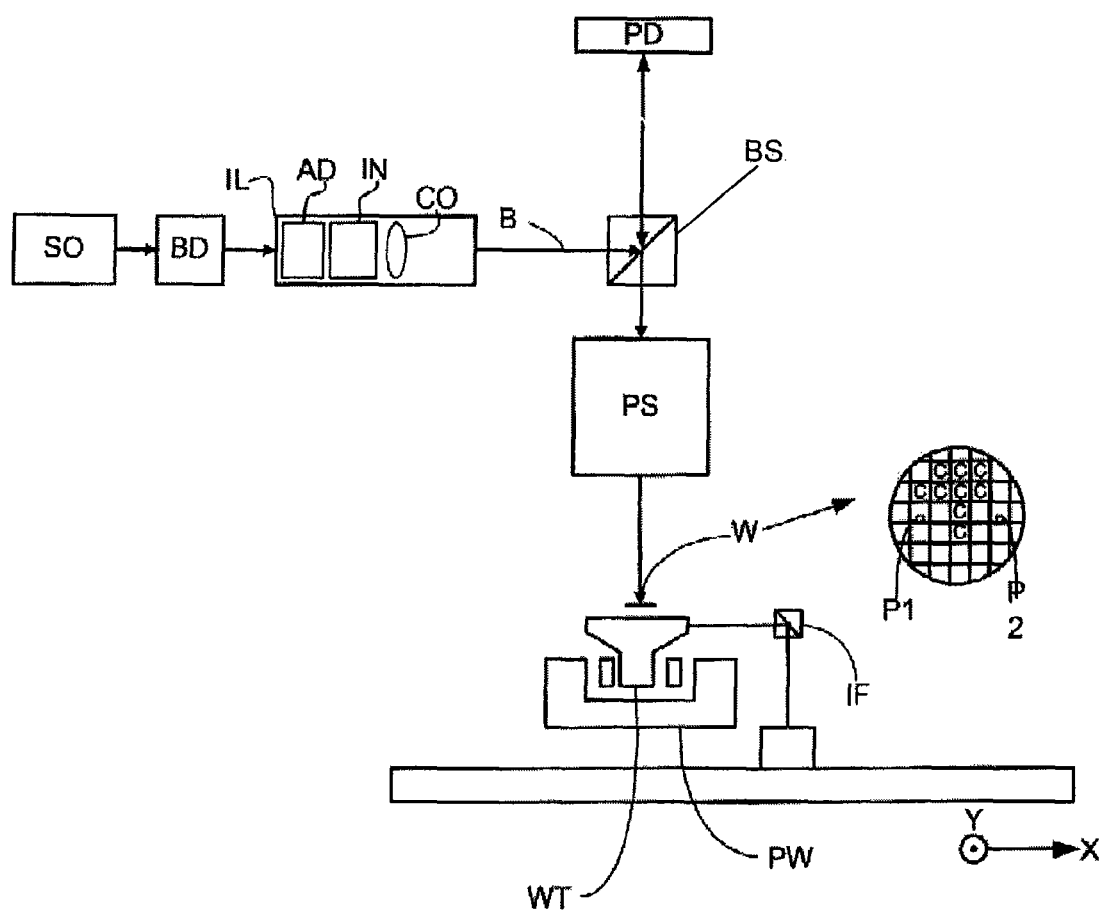
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g., UV radiation);

a patterning device PD (e.g., an array of individually controllable elements) that modulates the radiation beam; in general the position of the array of individually controllable elements will be fixed relative to item PS; however it may instead be connected to a positioner configured to accurately position the array of individually controllable elements in accordance with certain parameters;

a substrate table WT constructed to support a substrate (e.g., a resist-coated substrate) W and connected to a positioner PW configured to accurately position the substrate in accordance with certain parameters; and a projection system (e.g., a refractive projection lens system) PS configured to project the beam of radiation modulated by the array of individually controllable elements onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The term "patterning device," used herein should be broadly interpreted as referring to any device that can be used to modulate the cross-section of a radiation beam such as to create a pattern in a target portion of the substrate. It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes. Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays. Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In an embodiment, the patterning device comprises at least 10 programmable elements, e.g., at least 100, at least 1000, at least 10000, at least 100000, at least 1000000, or at least 10000000 programmable elements. Embodiment of several of these devices are discussed in some more detail below:

- A programmable mirror array. This may comprise a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate; in this manner, the beam becomes patterned according to the addressing pattern of the matrix-addressable surface. It will be appreciated that, as an alternative, the filter may filter out the diffracted light, leaving the undiffracted light to reach the substrate. An array of diffractive optical MEMS devices may also be used in a corresponding manner. A diffractive optical MEMS device is comprised of a plurality of reflective ribbons that may be deformed relative to one another to form a grating that reflects incident light as diffracted light. A further alternative embodiment of a programmable mirror array employs a matrix arrangement of tiny mirrors, each of which may be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam may be patterned according to the addressing pattern of the matrix-addressable mirrors. The required matrix addressing may be performed using a suitable electronic device. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entirety.
- A programmable LCD array. An example of such a construction is given in U.S. Pat. No. 5,229,872, which is incorporated herein by reference in its entirety.

The lithographic apparatus may comprise one or more contrast devices. For example, it may have a plurality of arrays of individually controllable elements, each controlled independently of each other. In such an arrangement, some or all of the arrays of individually controllable elements may have at least one of a common illumination system (or part of an illumination system), a common support structure for the arrays of individually controllable elements and/or a common projection system (or part of the projection system).

In an embodiment, such as the embodiment depicted in FIG. 1, the substrate W has a substantially circular shape, optionally with a notch and/or a flattened edge along part of its perimeter. In an embodiment, the substrate has a polygonal shape, e.g., a rectangular shape. Embodiments where the substrate has a substantially circular shape include embodiments where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm. Embodiments where the substrate is polygonal, e.g., rectangular, include embodiments where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm. In an embodiment, at least one side of the substrate has a length of at most 1000 cm, e.g., at most 750 cm, at most 500 cm, at most 350 cm, at most 250 cm, at most 150 cm, or at most 75 cm. In an embodiment, the substrate W is a wafer, for instance a semiconductor wafer. In an embodiment, the wafer material is selected from the group consisting of Si, SiGe, SiGeC, SiC, Ge, GaAs, InP, and InAs. In one embodiment, the wafer is a III/V compound semiconductor wafer. In an embodiment, the wafer is a silicon wafer. In an embodiment, the substrate is a ceramic substrate. In an embodiment, the substrate is a glass substrate. In an embodiment, the substrate is a plastic substrate. In an embodiment, the substrate is transparent (for the naked human eye). In an embodiment, the substrate is colored. In an embodiment, the substrate is absent a color. The thickness of the substrate may vary and, to an extent, may depend, e.g., on the substrate material and/or the substrate dimensions. In an embodiment, the thickness is at least 50 µm, for instance at least 100 µm, at least 200 µm, at least 300 µm, at least 400 µm, at least 500 µm, or at least 600 µm. In one embodiment, the thickness of the substrate is at most 5000 µm, for instance at most 3500 µm, at most 2500 µm, at most 1750 µm, at most 1250 µm, at most 1000 µm, at most 800 µm, at most 600 µm, at most 500 µm, at most 400 µm, or at most 300 µm. The substrate referred to herein may be processed, before or after exposure, in for example a track (a tool that typically applies a layer of resist to a substrate and develops the exposed resist), a metrology tool and/or an inspection tool. In an embodiment, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

The projection system may image the pattern on the array of individually controllable elements such that the pattern is coherently formed on the substrate; alternatively, the projection system may image secondary sources for which the elements of the array of individually controllable elements act as shutters. In this respect, the projection system may comprise an array of focusing elements such as a micro lens array (known as an MLA) or a Fresnel lens array, e.g., to form the secondary sources and to image spots onto the substrate. In an embodiment, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In an embodiment, the number of individually controllable elements in the patterning device is equal to or greater than the number of focusing elements in the array of focusing elements. In an embodiment, one or more (e.g., 1000 or more, the majority, or about each) of the focusing elements in the array of focusing elements may be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In an embodiment, the MLA is movable (e.g., with the use of actuators) at least in the direction to and away from the substrate, e.g., with the use of one or more actuators.

Being able to move the MLA to and away from the substrate allows, e.g., for focus adjustment without having to move the substrate.

As here depicted, the apparatus is of a reflective type (e.g., employing a reflective array of individually controllable elements). Alternatively, the apparatus may be of a transmissive type (e.g., employing a transmissive array of individually controllable elements).

The lithographic apparatus may be of a type having two (dual stage) or more substrate tables. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by an "immersion liquid" having a relatively high refractive index, e.g., water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. In an embodiment, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In an embodiment, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In an embodiment, the radiation has a wavelength including 436 nm, 405 nm, 365 nm, 355 nm, 248 nm, 193 nm, 157 nm, and/or 126 nm. In an embodiment, the radiation includes a wavelength of around 365 nm or around 355 nm. In an embodiment, the radiation includes a broad band of wavelengths, for example encompassing 365, 405 and 436 nm. A 355 nm laser source could be used. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL, may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross-section. The illuminator IL, or an additional component associated with it, may also be arranged to divide the radiation beam into a plurality of sub-beams that may, for example, each be associated with one or a plurality of the individually controllable elements of the array of individually controllable elements. A two-dimensional diffraction grating may, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF (e.g., an interferometric device, linear encoder or capacitive sensor), the substrate table WT can be moved accurately, e.g., so as to position different target portions C in the path of the radiation beam B. Where used, the positioning device for the array of individually controllable elements can be used to correct accurately the position of the patterning device PD with respect to the path of the beam B, e.g., during a scan. In an embodiment, movement of the substrate table WT is realized with the aid of a long-stroke module (course positioning) and a short-stroke module (fine positioning), which are not explicitly depicted in FIG. 1. In an embodiment, the apparatus does not include at least a short stroke module for moving substrate table WT. A similar system may also be used to position the array of individually controllable elements. It will be appreciated that the radiation beam B may alternatively/additionally be moveable while the object table and/or the array of individually controllable elements may have a fixed position to provide the required relative movement. Such an arrangement may assist in limiting the size of the apparatus. As a further alternative, which may, e.g., be applicable in the manufacture of flat panel displays, the position of the substrate table WT and the projection system PS may be fixed and the substrate W may be arranged to be moved relative to the substrate table WT. For example, the substrate table WT may be provided with a system for scanning the substrate W across it at a substantially constant velocity.

As shown in FIG. 1, the beam of radiation B may be directed to the patterning device PD using a beam splitter BS configured such that the radiation is initially reflected by the beam splitter and directed to the patterning device PD. It should be realized that the beam of radiation B may also be directed at the patterning device without the use of a beam splitter. In an embodiment, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements may be used to direct the beam of radiation B to the patterning device PD and subsequently to the projection system PS. In particular, an arrangement such as is shown in FIG. 1 may not be required if a transmissive patterning device is used.

The depicted apparatus can be used in four preferred modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the projected beam B is caused to scan a line across the substrate W. The pattern on the array of individually controllable elements is updated as required between pulses of the radiation system and the pulses are timed such that successive target portions C are exposed at the required locations on the substrate W. Consequently, the projected beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the projected beam B scans across the substrate W and exposes it. A substantially constant radiation source or a pulsed radiation source, synchronized to the updating of the pattern on the array of individually controllable elements may be used.

Combinations and/or variations on the above described modes of use or entirely different modes of use may also be employed.

Figure 2:
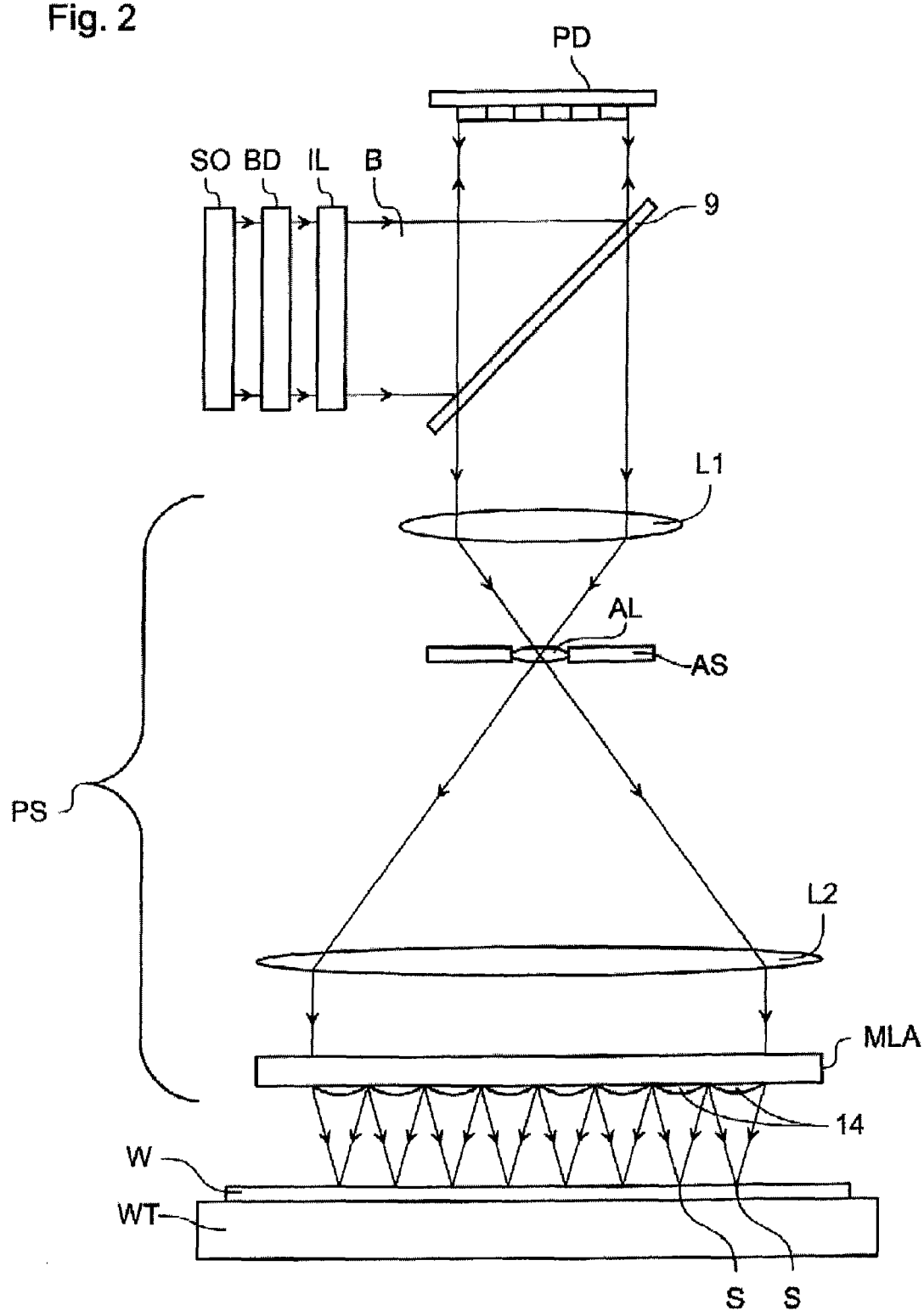
FIG. 2 depicts a lithographic apparatus according to another embodiment of the invention.

FIG. 2 depicts an arrangement of the apparatus according to an embodiment of the invention that may be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL may be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses may comprise many thousands of lenses (the same is true of the array of individually controllable elements used as the patterning device PD).

Figure 3:
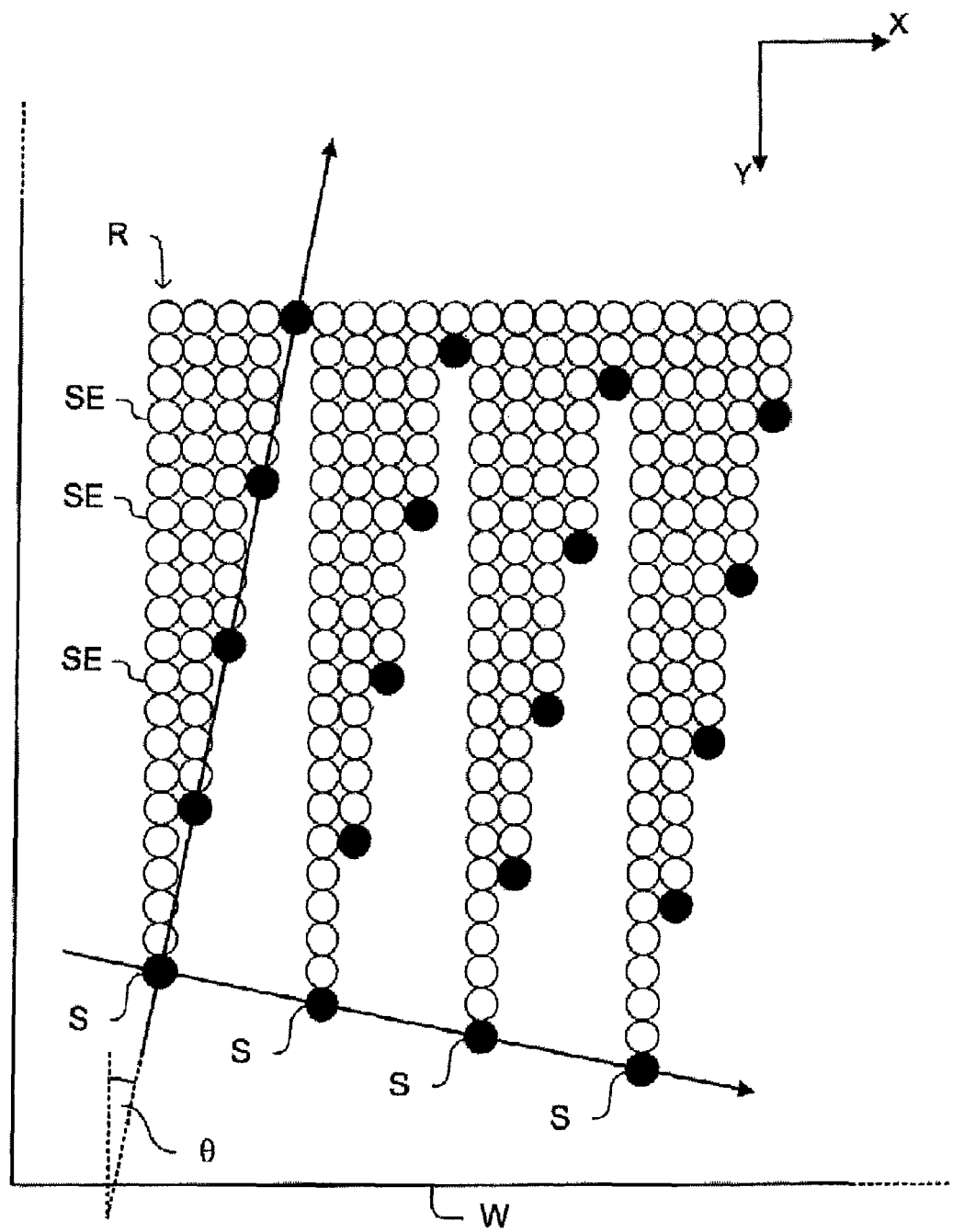
FIG. 3 depicts a mode of transferring a pattern to a substrate using an embodiment of the invention as show in FIG. 2.

FIG. 3 illustrates schematically how the pattern on the substrate W may be generated. The filled in circles represent the array of spots S projected onto the substrate by the array of lenses MLA in the projection system PS. The substrate is moved relative to the projection system in the Y direction as a series of exposures are exposed on the substrate. The open circles represent spot exposures SE that have previously been exposed on the substrate. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging."

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots S. In an embodiment, the angle $\theta$ is at most 20°, 10°, for instance at most 5°, at most 3°, at most 1°, at most 0.5°, at most 0.25°, at most 0.10°, at most 0.05°, or at most 0.01°. In an embodiment, the angle $\theta$ is at least 0.001°.

Figure 4:
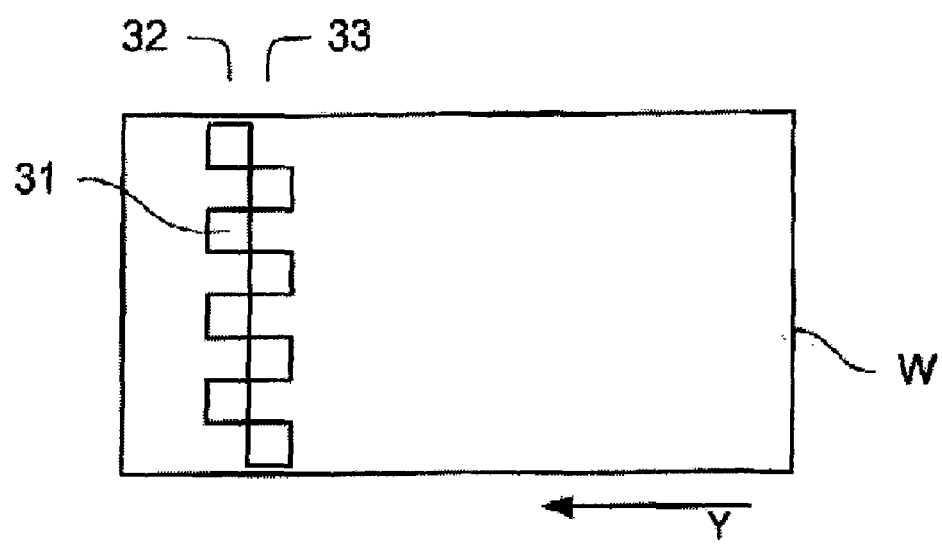
FIG. 4 depicts an arrangement of optical engines.

FIG. 4 shows schematically how the entire flat panel display substrate W may be exposed in a single scan, by using a plurality of optical engines. Eight arrays 31 of radiation spots S are produced by eight optical engines (not shown), arranged in two rows 32,33 in a 'chess board' configuration such that the edge of one array of radiation spots S slightly overlaps (in the scanning direction Y) with the edge of the adjacent array of radiation spots S. In an embodiment, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines may be used. In an embodiment, the number of optical engines is at least 1, for instance at least 2, at least 4, at least 8, at least 10, at least 12, at least 14, or at least 17. In an embodiment, the number of optical engines is less than 40, e.g., less than 30 or less than 20.

Each optical engine may comprise a separate illumination system IL, patterning device PD and projection system PS as described above. It is to be appreciated, however, that two or more optical engines may share at least a part of one or more of the illumination system, patterning device and projection system.

FIGS. 5 and 6 show an embodiment of a substrate handler generally indicated with the reference number 1. The substrate handler 1 is configured to load a substantially flat substrate 2, in particular a flat panel display, on a substrate table 15 indicated with the reference sign 10. The substrate handler 1 comprises a support surface 3 to support the substantially flat substrate 2. This support surface 3 defines a support plane in which the substrate 2 is supported.

The substrate handler 1 comprises a conveyor device 5 for moving a substrate 2 in a plane substantially parallel to the support plane. When the substrate handler 1 is located next to the substrate table 15 and the support plane of the substrate handler 1 is substantially located in the same plane as the support surface/plane of the substrate table 15, usual a horizontal plane, the substrate 2 may with a movement in the indicated direction be moved on/or from the substrate table 15. Since this movement is parallel to the support surface/plane of the substrate table 15, the substrate handler 1 does not require a considerable amount of space above the substrate table 15. Therefore, it is possible to place other objects above the substrate table 15, such as for instance a lens column or such. In some lithographic apparatuses is such positioning of the lens above the substrate table 15 possible. For such embodiments it is with the present substrate handler 1 possible to load and/or unload a substrate 2 on/from the substrate table 15 without moving the substrate table 15 to a position wherein the lens is not anymore above the substrate table 15. This makes the loading/unloading of substrates 3 more efficient.

The conveyor device 5 comprises a gripping device and a driving device for moving the gripping device. The gripping device is configured to grip a substrate 2 so that the substrate 2 can be moved by pushing and pulling while it stays in a defined position with respect to at least the moving part of the gripping device. Since the substrate 2 is actually gripped by the gripping device the substrate 2 may during a loading/unloading movement be accelerated at a high rate as the position with respect to the gripping device will be constant.

The gripping device comprises a beam 6 on which a number of vacuum fingers 7 are arranged. These vacuum fingers 7 are provided with holes (vacuum pads) that can be placed against the underside of the substrate 2. When the interior of the holes is placed in a vacuum by pumping the air out of the holes, the vacuum fingers 7 will grip the substrate 2. In an embodiment, the vacuum fingers 7 are movable in a direction perpendicular on the support plane, for instance by mounting the vacuum fingers pivotably on the beam, so that the vacuum fingers 7 can easily move towards the bottom surface of the substrate 2 when the holes are vacuumized.

The vacuum fingers 7 are located in grooves 8 which are provided in the support surface 3 of the substrate handler 1 so that the vacuum fingers 7 are capable of gripping the underside of the substrate 2 without having an influence on the support position of the substrate 2.

A consequence of the use of grooves 8 in the support surface 3 of the substrate table 15 may be that at least a part of the substrate table 15 also has to be provided with (partial) grooves 16 to make a full exchange between the substrate handler 1 and the substrate table 15 and possible.

As an alternative for the vacuum fingers 7 other gripping devices for gripping the substrate 2 may be used, such as clamps. However, vacuum fingers 7 are desirable as vacuum is suitable to grip a substrate 2 while only having contact with one side of the substrate 2. It is generally not desirable to contact both sides of the substrate 2 as on one of these sides (usually the top side) an image is projected. This image may be damaged when a gripping device would contact this image. Furthermore, the chance that the use of vacuum will give any damage to the substrate 2 in general is very limited compared to other gripping devices.

The driving device comprises for instance a belt and two (gear) wheels on which the belt is mounted. The belt is connected with the beam 6 on which the vacuum fingers 7 are arranged. The driving device can move the beam 6 towards the substrate table 15 to load a substrate 2 on the substrate table 15 and away from the substrate table 15 to unload a substrate from the substrate table 15. Any known alternative driving device to drive the gripping device may be used in the substrate handler 1. Possible suitable driving devices may include linear motors, hydraulic motors, pneumatic motors and such.

The substrate handler 1 is provided with a lifting device in the form of lifting pins 9 for exchanging a substrate 2 between the substrate handler 1 and a robot. Such lifting pins 9 may lift a substrate 2 from the support surface 3 so that forks or other holding elements of a robot can be brought under the substrate 2. For accommodating the lifting pins 9 in the substrate handler 1, cut-outs are provided in the support surface 3 of the substrate handler 1.

The robot may be used for transporting the substrate 2 to and from a substrate loading station or any other (temporarily) storage station. Robots suitable to exchange a substrate 2 with the substrate handler 1 are known for the man skilled in the art.

The substrate table 15 is provided with a float device 10 to keep a substrate floating above the support surface 3 and therewith reduce the friction between substrate and substrate handler 1 during transport from the substrate handler 1 to the substrate table 15 or vice versa by providing an air bed between the support surface 3 of substrate handler 1 and a substrate 2 supported on the support surface 3. This float device 10 comprises a number of small holes 11 in the support surface 3 of the substrate table 15 which holes 11 are connected with an air pump or other air supply device. (Only a limited number of these holes 11 is shown in FIGS. 5 and 6. In an embodiment, the holes are provided throughout substantially the whole support surface 3). When the air pump is activated air streams out of the holes 11 so that the substrate 2 is supported on an air bed. It is remarked that any other suitable fluid may also be used to keep the substrate 2 floating.

The float device 10 may be used to reduce the friction of the gripping device on the substrate support. For instance in the case of an air bed provided by air introduced between substrate 2 and support surface 3 through holes in the support surface, this air bed may be used so that a substrate 2 and the gripping device, in particular the beam 6 can float on the substrate handler 1.

In order to reduce the friction between the substrate 2 and the substrate table 15, the substrate table 15 may also be provided with a float device 10 which provides an air bed.

The substrate handler 1 further comprises a conditioning device 12 for conditioning a substrate 2 before it is loaded on the substrate table 15. This conditioning is needed to bring the temperature in the substrate 2 within a certain temperature range i.e. a substantial uniform temperature distribution within the substrate 2, before the exposure process of the substrate 2 on the substrate table 15 is started. Normally the temperature within the substrate 2 is not within this desired temperature range when a robot places it on the support surface 3 of the substrate handler 1. By conditioning the substrate 2 using the conditioning device 12, the substrate 2 can be brought to a substantially uniform temperature. For instance, when introducing a substrate 2 out on the substrate handler 1, the temperature within the substrate may be 23±2° C., while the desired output temperature is 23±0.03° C.

The conditioning device shown in FIGS. 5 and 6 comprises a conditioning fluid circuit, in particular a conditioning water (cooling water) circuit 13 for maintaining the support surface 3 on a substantially constant temperature for conditioning a substrate 2 which is supported on the support surface. This conditioning water circuit 13 is integrated in the substrate handler 1 below the support surface. In FIG. 5 only a part of the conditioning water circuit 13 is shown. In an embodiment, the conditioning water circuit is present under practically the whole support surface 3 of the substrate handler 1.

As described above, grooves 8 and cutouts for the lifting pins 9 are provided in the support surface 3 of the substrate handler 1 in order to make an exchange of the substrate with the substrate handler 15 and/or a robot possible. However, these irregularities in the support surface 3 may have a negative influence on the conditioning of substrates in general. In particular, the irregularities may have a negative impact on the substrate temperature uniformity, which is caused by the poor thermal conductivity between the substrate 2 and the support surface 3 above a groove 8 or cutout in the support surface 3.

In an embodiment, the substrate 2 is displaced during the conditioning process from one conditioning position to one or more other conditioning positions, so that different parts of the substrate 2 to be conditioned are located above the irregularities in the support surface throughout the conditioning process. By placing during the conditioning process different parts of the substrate 2 above the irregularities, such as grooves 8 and cut-outs, a substantial uniform temperature distribution is obtained in the substrate 2 within a substantial smaller conditioning time, when compared to conditioning the substrate without displacing it.

In an embodiment, the total distance of displacement of a substrate 2 during a conditioning process in a certain direction is at least the dimension in that direction of the respective irregularity in account of which the substrate 2 is displaced. This distance may be bridged in one or more steps or in a continuous motion. In order to bring other parts of the substrate 2 above the irregularities, the substrate 2 may be moved in one or more directions substantially parallel to the support surface 3.

Since the conditioning time needed to obtain an acceptable uniform temperature distribution in the substrate is lower in embodiments of the present invention, the throughput of the lithographic apparatus may be higher.

As discussed above, there may be a risk of contamination due to particles sticking to the bottom side of the substrate. In this respect, in an embodiment of the invention, a substrate 2 is kept on the substrate handler 1 floating on an air bed during actual conditioning of the substrate 2. In an embodiment, the substrate 2 is kept floating during the whole handling of the substrate 2 by the substrate handler 1.

The provision of an air bed between the substrate 2 and the support surface 3 during the conditioning process makes the risk on particles, such as dust particles, sticking to the bottom of the substrate 2 considerably lower, as the substrate 2 does not come into contact with the support surface 3. Furthermore, due to the floating of the substrate during conditioning a more uniform temperature distribution may be obtained compared to a substrate 2 which directly lies on the support surface 3, as the sharp transitions at the edges of the irregularities are of substantially less influence.

Since air has a low thermal conductivity, in an embodiment, the substrate 2 is kept as close as possible to the support surface for conditioning. However, in view of the risk for contamination of the substrate 2, the substrate 2 should be kept floating on a minimum height. In an embodiment, the float height of the substrate 2 during actual conditioning is in the range of 0.01-0.15 mm, more preferably in the range of 0.025-0.075 mm and even more preferably about 0.05 mm above the support surface.

In an embodiment, the float height of the substrate 2 during transport thereof is higher than the float height of the substrate 2 during conditioning, as the risk on contamination and on in particular the damage that may be caused by dragging a particle along between substrate 2 and the support surface 3 is considerably higher. In an embodiment, during transport of a substrate 2, the substrate 2 is kept floating on a float height of at least 0.10 mm, preferably at least 0.15 mm, and even more preferably at least 0.20 mm.

In an embodiment, the float height during conditioning is lower than the float height during substrate 2 transport/moving, the substrate 2 is brought during conditioning in two or more distinct positions with respect to the support surface, so that between moving the substrate 2 from one conditioning position to an other conditioning position, the substrate 2 can be brought to a lower float height, wherein the conditioning is optimal, and during moving the substrate 2, the substrate 2 can be brought to a higher float height, wherein dragging of particles is mainly avoided.

As an alternative it is possible to constantly move the substrate 2 with respect to the support surface. However, then a sub-optimal float height has to be chosen which will depend on a choice between lower conditioning time of the substrate 2, and the risk of dragging particles along with the movement of the substrate 2.

In an embodiment, the direction of movement during displacement of the substrate 2 with respect to the support surface 3 is at least partly perpendicular to the loading direction (A) of the substrate handler 1 to load a substrate on the substrate table 15, since the irregularities in the support surface, in particular the grooves 8 for the vacuum fingers are located in this loading direction. By moving the substrate 2 at least partly perpendicular to this loading direction, different parts of the substrate 2 are located above the irregularities in the support surface 3 of substrate handler 1.

In the embodiment shown in FIGS. 5 and 6, the substrate 2 is displaced during conditioning in a direction perpendicular to the loading direction, the latter being indicated with the arrow A in FIG. 6, whereby the distance of movement during conditioning is preferably at least the width of a groove. In FIG. 5, a first condition position of a substrate 2 is shown in solid lines and a second conditioning position of a substrate 2 is shown in dashed lines. It is also possible to displace the substrate 2 over this distance in two or more steps.

In order to make this movement possible, the vacuum fingers 7 may, for instance, be moved in the direction perpendicular to the loading direction A. For this reason the grooves 8 may be locally widened so that the vacuum fingers 7 can move in this direction. However, any other suitable device for displacing the substrate during the conditioning process may also be applied.

In an alternative embodiment, it is possible that the displacement of a substrate 2 during a conditioning process is applied when the substrate 2 during the actual conditioning rests on the support surface 3 of the substrate handler 1 instead of being supported on an air bed as described above. In such embodiment the substrate 2 is lifted from the support surface 3 by using the float device 10 for each movement of the substrate 2 from one conditioning position to an other conditioning position. It will be clear that in such embodiment the risk of contamination will not be avoided as the substrate comes into contact with the support surface during the actual conditioning. Nevertheless, the time needed to obtain a substantial uniform temperature distribution is considerably less than without displacing the substrate 2.

In an embodiment, when loading a substrate 2 on the substrate table 15 of a lithographic apparatus using a substrate handler 1, the following acts are subsequently performed. A robot takes a substrate 2 out of a substrate loading station and places the substrate 2 on the lifting pins which are lifted above the support surface 3 of the substrate handler 1. Then, the lifting pins are retracted in the support surface 3 of the substrate handler 1, the gripping device grips the substrate 2, and the float device 10 is activated to make the substrate 2 floating on an air bed. The float height of this air bed is for instance about 0.05 mm. On this float height, the substrate 2 is conditioned by the conditioning device. During conditioning, the substrate 2 may be moved from one conditioning position to another conditioning position, whereby the substrate 2 may temporarily be lifted by float device 10 to a higher float height of, for instance, about 0.2 mm in order to avoid contamination of or damage to the substrate 2. After the conditioning process is finished the substrate 2 is brought to a higher float height of for instance about 0.2 mm and subsequently transported to the substrate table 15 for projecting an image thereon.

In the above description a substrate handler 1 is described for conditioning and loading one substrate on the substrate table 15. However, the substrate handler according the invention may be used for simultaneously conditioning and loading two or more substrates on the substrate table 15. Such two or more substrates may be transported on top of each other or next to each other. The two or more substrates may be of different sizes and shapes. In an embodiment, two substrates of half the size of the size of the substrate shown in FIG. 5, are simultaneously conditioned and subsequently transported by the substrate handler 1, whereby the two substrates are located next to each other on the support surface of the substrate handler 1.

In the drawings only one substrate handler 1 is shown in combination with a substrate table 15. It may be possible to provide (two or more) substrate handlers 1 in combination with one (or more). For instance, for one substrate table 15 one substrate handler 1 may be provided for loading substrates on the substrate table 15 and another substrate handler 1 may be provided for unloading substrates from the substrate table 15. With such arrangement a more efficient handling of the substrates and a higher throughput may be obtained. It will be appreciated that in such embodiment only the substrate handler for loading a substrate on the substrate table has to be provided with a conditioning device.

Although specific reference may be made in this text to the use of lithographic apparatus in the manufacture of a specific device (e.g., an integrated circuit or a flat panel display), it should be understood that the lithographic apparatus described herein may have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus may be used to assist in the creation of a variety of layers, e.g., a thin film transistor layer and/or a color filter layer.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be appreciated by one skilled in the art that modifications may be made to the invention as described without departing from the scope of the claims set out below.

What is claimed is:

1. An apparatus comprising:
   a conditioning device configured to condition a substrate on a support surface;
   a float device configured to provide an air bed above the support surface, wherein the float device is configured to float the substrate on the air bed during conditioning of the substrate;
   a displacing device configured to displace the substrate, during the conditioning, from one conditioning position to one or more other conditioning positions;
   a pattern generating device having an emissive portion configured to produce a patterned beam; and
   a projection system configured to project the patterned beam onto a target portion of the conditioned substrate.

2. The apparatus of claim 1, further comprising:
   a substrate table configured to receive the conditioned substrate from a substrate handler; and
   a conveyor device configured to load the conditioned substrate from the substrate handler to the substrate table.

3. The apparatus of claim 2, wherein the conveyor device is configured to move the conditioned substrate in a plane substantially parallel to a support plane of the substrate table.

4. The apparatus of claim 1, wherein the displacing device is configured to continuously move the substrate during the conditioning.

5. The apparatus of claim 1, wherein the displacing device comprises a gripping device configured to grip the substrate for moving the substrate in a direction substantially parallel to the support surface.

6. The apparatus of claim 1, wherein the float device is configured to maintain a float height of about 0.01-0.15 mm above the support surface during the conditioning.

7. The apparatus of claim 1, wherein the emissive portion comprises an array of diodes.

8. The apparatus of claim 1, wherein the pattern generating device is configured to provide the patterned beam for the target portion of the conditioned substrate that corresponds to a functional layer of a device to be created in the target portion.

9. A method comprising:
   conditioning a substrate on a support surface;
   providing an air bed above the support surface, wherein the substrate floats on the air bed during conditioning of the substrate;
   displacing the substrate from one conditioning position to one or more other conditioning positions during the conditioning;
   producing a patterned beam; and
   projecting the patterned beam onto a target portion of the conditioned substrate.

10. The method of claim 9, further comprising loading the conditioned substrate onto a substrate table after the conditioning.

11. The method of claim 10, wherein the loading comprises moving the conditioned substrate in a plane substantially parallel to a support plane of the substrate table.

12. The method of claim 9, wherein the displacing comprises continuously moving the substrate during the conditioning.

13. The method of claim 9, wherein providing the air bed comprises gripping the substrate to move the substrate in a direction substantially parallel to the support surface.

14. The method of claim 9, wherein providing the air bed comprises maintaining a float height of about 0.01-0.15 mm above the support surface during the conditioning.

15. The method of claim 9, further comprising using an array of diodes to produce the patterned beam.

16. The method of claim 15, wherein providing the patterned beam comprises providing the patterned beam for the target portion of the conditioned substrate that corresponds to a functional layer of a device to be created in the target portion.

17. A system comprising:
- an emissive device configured to produce a patterned beam;
- a substrate table configured to support a substrate;
- a projection system configured to project the patterned beam onto a target portion of the substrate supported on the substrate table; and
- a substrate handler configured to load the substrate on the substrate table, the substrate handler comprising:
- a conditioning device configured to condition the substrate on a support surface;
- a float device configured to provide an air bed above the support surface, wherein the float device is configured to float the substrate on the air bed during conditioning of the substrate; and
- a displacing device configured to displace the substrate, during the conditioning, from one conditioning position to one or more other conditioning positions.

18. The system of claim 17, wherein the substrate handler further comprises a conveyor device configured to load the conditioned substrate from the substrate handler to the substrate table.

19. The system of claim 18, wherein the conveyor device is configured to move the conditioned substrate in a plane substantially parallel to a support plane of the substrate table.

20. The system of claim 17, wherein the emissive device comprises an array of diodes.

21. The system of claim 17, wherein the emissive device is configured to modulate a cross-section of the patterned beam for the target portion of the substrate that corresponds to a functional layer of a device to be created in the target portion.

* * * * *